(12) United States Patent
Lu

(10) Patent No.: US 7,045,952 B2
(45) Date of Patent: May 16, 2006

(54) OLEDS WITH MIXED HOST EMISSIVE LAYER

(75) Inventor: Michael Lu, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 10/793,371

(22) Filed: Mar. 4, 2004

(65) Prior Publication Data
US 2005/0194892 A1    Sep. 8, 2005

(51) Int. Cl.
*H01J 1/62*    (2006.01)
(52) U.S. Cl. .......................... 313/504; 313/506
(58) Field of Classification Search ............... 313/504, 313/506, 502, 498; 428/690, 917, 212
See application file for complete search history.

(56) References Cited

U.S. PATENT DOCUMENTS

| | | | |
|---|---|---|---|
| 4,769,292 A | | 9/1988 | Tang et al. |
| 5,247,190 A | | 9/1993 | Friend et al. |
| 5,703,436 A | | 12/1997 | Forrest et al. |
| 5,707,745 A | | 1/1998 | Forrest et al. |
| 5,773,929 A | * | 6/1998 | Shi et al. ................. 313/504 |
| 5,834,893 A | | 11/1998 | Bulovic et al. |
| 5,834,894 A | * | 11/1998 | Shirasaki et al. ......... 313/509 |
| 5,844,363 A | | 12/1998 | Gu et al. |
| 5,853,905 A | | 12/1998 | So et al. |
| 5,925,980 A | * | 7/1999 | So et al. ................... 313/504 |
| 6,010,796 A | * | 1/2000 | Kijima ..................... 428/690 |
| 6,013,982 A | | 1/2000 | Thompson et al. |
| 6,087,196 A | | 7/2000 | Sturm et al. |
| 6,091,195 A | | 7/2000 | Forrest et al. |
| 6,097,147 A | | 8/2000 | Baldo et al. |
| 6,130,001 A | | 10/2000 | Shi et al. |
| 6,191,764 B1 | * | 2/2001 | Kono et al. .............. 345/76 |

(Continued)

FOREIGN PATENT DOCUMENTS

EP    1 220 339    7/2002

(Continued)

OTHER PUBLICATIONS

Lu, et al., U.S. Appl. No. 09/931,948, filed Aug. 20, 2001, entitled "Transparent electrodes".

(Continued)

*Primary Examiner*—Joseph Williams
*Assistant Examiner*—Dalei Dong
(74) *Attorney, Agent, or Firm*—Kenyon & Kenyon LLP

(57) ABSTRACT

An organic light emitting device is provided. The devices of the present invention comprise an emissive region having at least two emissive layers, with at least one layer comprising a first host and another layer comprising a first and a second host, and each layer further comprising a phosphorescent emissive material. In one embodiment, the device comprises an emissive region disposed between and electrically connected to an anode and a cathode, wherein the emissive region comprises (i) a first single-host emissive layer, comprising a first host material, and (ii) a mixed-host emissive layer in direct contact with the first single-host layer, wherein the mixed-host layer comprises the first host material, and a second host material, and wherein the first single-host layer and the mixed-host layer each further comprise a phosphorescent emissive material. In another embodiment, the device further comprises (iii) a second single-host emissive layer, comprising a second host material, and wherein the first single-host layer, the mixed-host layer, and the second single-host layer each further comprise a phosphorescent emissive material.

25 Claims, 9 Drawing Sheets

U.S. PATENT DOCUMENTS

| | | | |
|---|---|---|---|
| 6,194,089 | B1 | 2/2001 | Choong et al. |
| 6,224,966 | B1* | 5/2001 | Sakai et al. ............... 428/212 |
| 6,294,398 | B1 | 9/2001 | Kim et al. |
| 6,303,238 | B1 | 10/2001 | Thompson et al. |
| 6,310,360 | B1 | 10/2001 | Forrest et al. |
| 6,337,102 | B1 | 1/2002 | Forrest et al. |
| 6,392,250 | B1* | 5/2002 | Aziz et al. ............... 257/40 |
| 6,468,819 | B1 | 10/2002 | Kim et al. |
| 6,501,102 | B1* | 12/2002 | Mueller-Mach et al. ...... 257/84 |
| 6,521,360 | B1* | 2/2003 | Lee et al. .............. 428/690 |
| 6,573,651 | B1* | 6/2003 | Adachi et al. ........... 313/504 |
| 6,614,175 | B1 | 9/2003 | Aziz et al. |
| 6,687,266 | B1* | 2/2004 | Ma et al. ................. 372/7 |
| 6,692,846 | B1* | 2/2004 | Hatwar et al. .......... 428/690 |
| 6,803,720 | B1 | 10/2004 | Kwong et al. |
| 6,867,538 | B1 | 3/2005 | Adachi et al. |
| 2002/0034656 | A1 | 3/2002 | Thompson et al. |
| 2002/0074935 | A1 | 6/2002 | Kwong et al. |
| 2002/0127427 | A1 | 9/2002 | Young et al. |
| 2002/0180347 | A1 | 12/2002 | Adachi et al. |
| 2002/0182441 | A1 | 12/2002 | Lamansky et al. |
| 2003/0072964 | A1 | 4/2003 | Kwong et al. |
| 2003/0230980 | A1 | 12/2003 | Forrest et al. |

FOREIGN PATENT DOCUMENTS

| | | |
|---|---|---|
| WO | 02/071813 | 9/2002 |
| WO | 02/074015 | 9/2002 |
| WO | WO 02/071813 | 9/2002 |
| WO | 03/100880 | 12/2003 |

OTHER PUBLICATIONS

Shtein, et al., U.S. Appl. No. 10/233,470, filed Sep. 4, 2002, entitled "Process and apparatus for organic vapor jet deposition".

U.S. Appl. No. 10/618,160 to Tung et al., filed Jul. 10, 2003.

Baldo et al., "Highly Efficient Phosphorescent Emission from Organic Electroluminescent Devices," Nature, vol. 395, pp. 151-154 (1998).

Baldo et al., "Very High-Efficiency Green Organic Light-Emitting Devices Based on Electrophosphorescence," Appl. Phys. Lett., vol. 75, No. 3, pp. 4-6 (1999).

Adachi et al., "Nearly 100% Internal Phosphorescent Efficiency in an Organic Light Emitting Device," J. Appl. Phys., vol. 90, pp. 5048 (2001).

Zhou et al., "Low-Voltage Inverted Transparent Vacuum Deposited Organic Light-Emitting Diodes Using Electrical Doping," Appl. Phys. Lett., vol. 81, No. 5 (2002).

International Search Report, Appln. No. PCT/US005/1006124, Feb. 24, 2005.

Zhou et al., "High-efficiency electrophosphorescent organic light-emitting diodes with double light-emitting layers" Appl. Phys. Lett., vol. 61, No. 21, p. 4070-7072 (2002).

Holmes et al., "Efficient, Deep-blue organic electrophosphorescence by guest charge trapping" Appl. Phys. Lett., vol. 83, No. 18, p. 3818-3820 (2003).

Aziz et al., "Study of organic light emitting devices with a 5.6,11,12-teraphenylnaphthacene (rubrene)-doped hole transport layer",Appl. Phys. Lett., vol. 80, No. 12, p. 2180-2182 (2002).

Aziz et al. "Degradation Mechanism of Small Molecule-Based Organic Light Emitting Devices", Science, vol. 283, p. 1900-1902 (1999).

* cited by examiner

OLEDS WITH MIXED HOST EMISSIVE LAYER

FIELD OF THE INVENTION

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

SUMMARY OF THE INVENTION

An organic light emitting device is provided. The devices of the present invention comprise an emissive region having at least two emissive layers, with at least one layer comprising a first host and another layer comprising a first and a second host, and each layer further comprising a phosphorescent emissive material.

In one embodiment of the present invention, the device comprises an emissive region disposed between and electrically connected to an anode and a cathode, wherein the emissive region comprises (i) a first single-host emissive layer, comprising a first host material, and (ii) a mixed-host emissive layer in direct contact with the first single-host emissive layer, wherein the mixed-host emissive layer comprises the first host material, and a second host material, and wherein the first single-host emissive layer and the mixed-host emissive layer each further comprise a phosphorescent emissive material.

In another embodiment of the present invention, the device comprises an emissive region disposed between and electrically connected to an anode and a cathode, wherein the emissive region comprise (i) a first single-host emissive layer, comprising a first host material, (ii) a mixed emissive layer, comprising the first host material and a second host material, (iii) a second single-host emissive layer, comprising a second host material, and wherein the first single-host emissive layer, the mixed-host emissive layer, and the second single-host emissive layer each further comprise a phosphorescent emissive material.

All doping percentages are weight % unless otherwise indicated.

Figure 8:
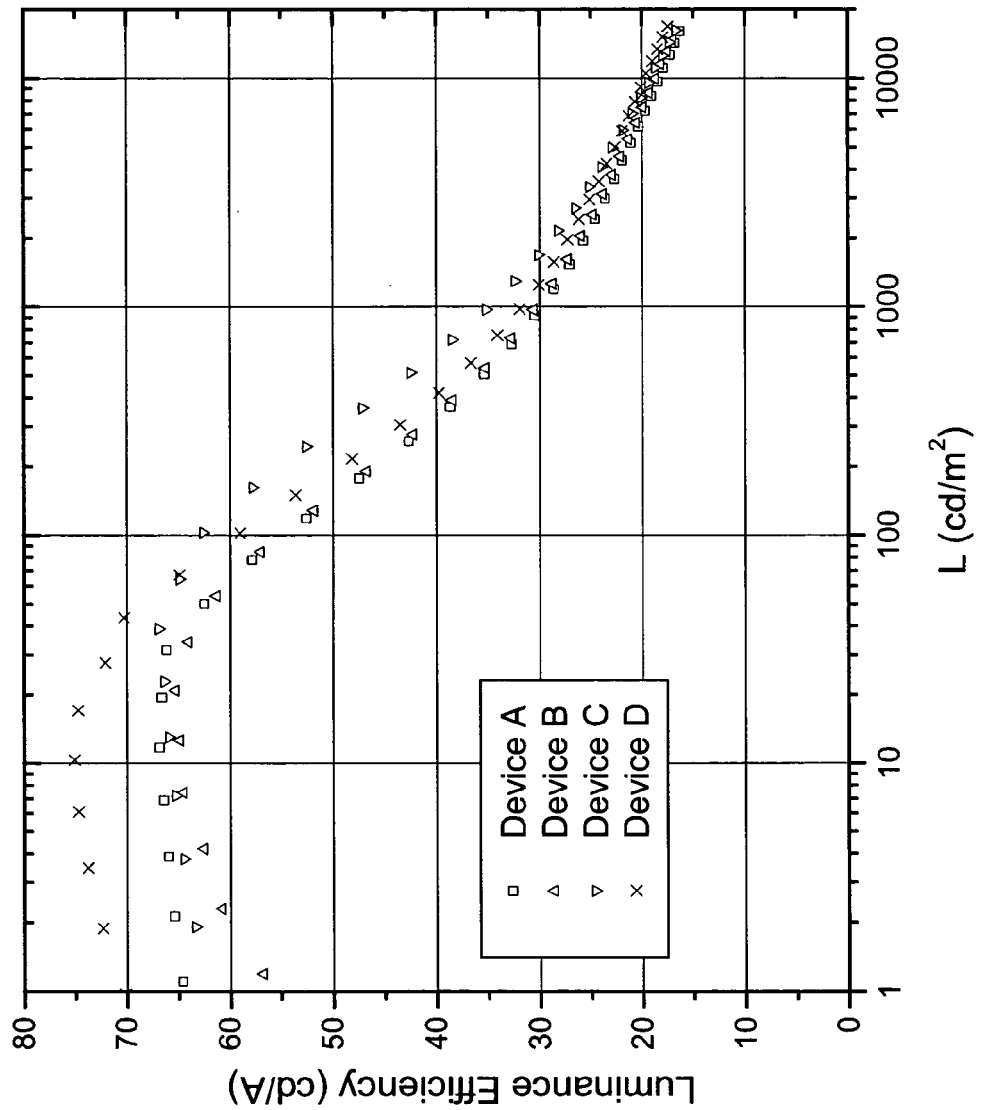

FIG. 8 shows plots of luminous efficiency (cd/A) and power efficiency (1 m/W) vs. brightness (cd/m$^2$) for devices of FIGS. 3–6 having the device structure A: ITO/CuPc(100 Å)/NPD(300 Å)/CBP:Ir(5-Phppy)$_3$ (4.5%) (200 Å)/CBP:TPBI(4.5%):Ir(5-Phppy)$_3$(4.5%) (50 Å)/TPBI:Ir(5-Phppy)$_3$(4.5%) (50 Å)/TPBI(400 Å)/LiF(10 Å)/Al(1000 Å), B: ITO/CuPc(100 Å)/NPD(300 Å)/CBP:Ir(5-Phppy)$_3$(4.5%) (200 Å)/CBP:TPBI(9%):Ir(5-Phppy)$_3$(4.5%) (50 Å)/TPBI:Ir(5-Phppy)$_3$(4.5%) (50 Å)/TPBI(400 Å)/LiF (10 Å)/Al(1000 Å), C: ITO/CuPc/NPD/CBP:Ir(5-Phppy)$_3$(200 Å, 4.5%)/TPBI: Ir(5-Phppy)$_3$(50 Å, 4.5%)/TPBI/LiF/Al, and D: ITO/CuPc/NPD/CBP:Ir(5-Phppy)$_3$(200 Å, 4.5%)/CBP: TPBI(13.6%):Ir(5-Phppy)$_3$(50 Å, 4.5%)/TPBI:Ir(5-Phppy)$_3$(50 Å, 4.5%)/TPBI/LiF/Al.

Figure 9:
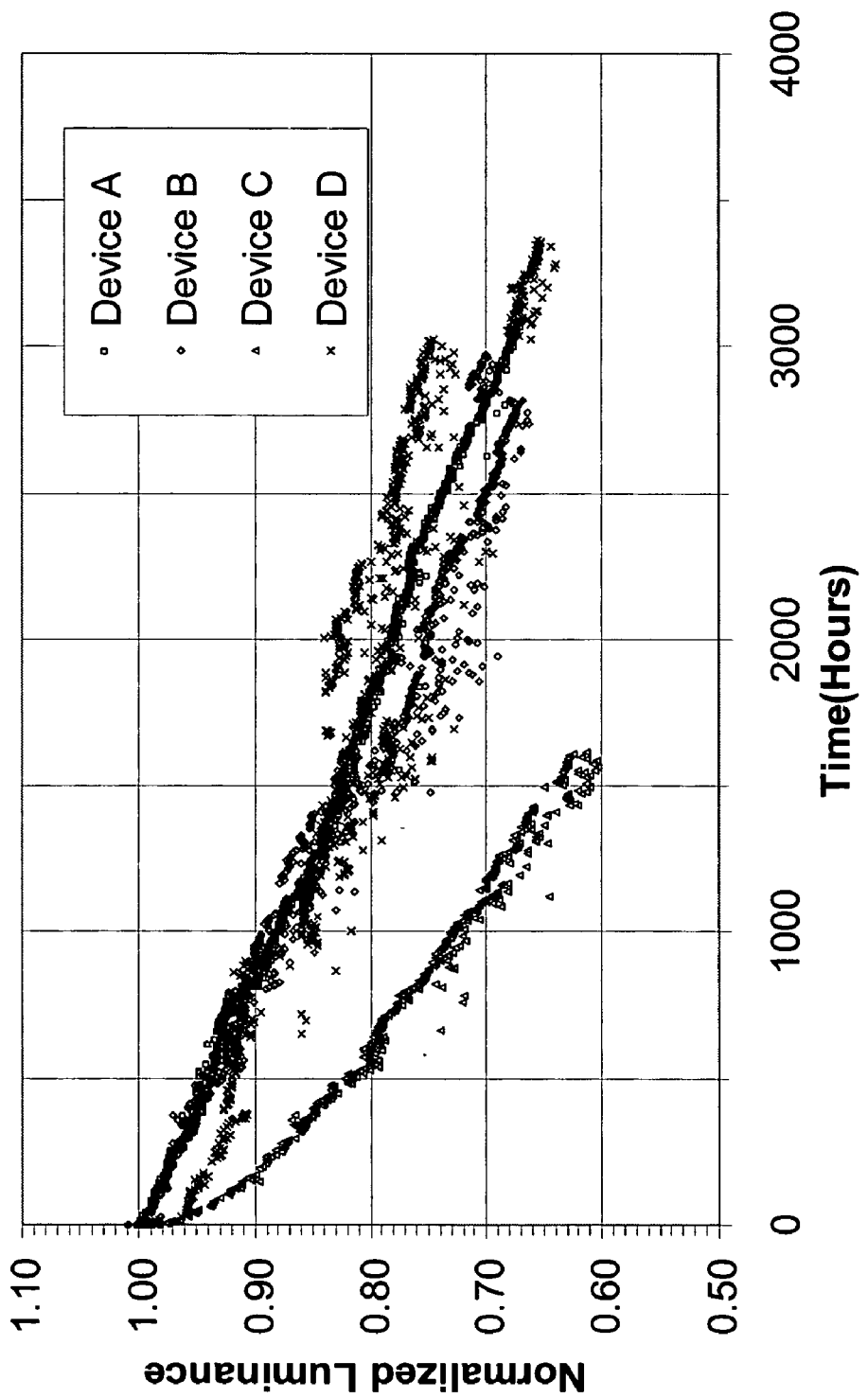

FIG. 9 shows plots of normalized luminance decay for devices of FIGS. 3–6 having the device structure A: ITO/CuPc(100 Å)/NPD(300 Å)/CBP:Ir(5-Phppy)$_3$ (4.5%) (200 Å)/CBP:TPBI(4.5%):Ir(5-Phppy)$_3$(4.5%) (50 Å)/TPBI:Ir(5-Phppy)$_3$(4.5%) (50 Å)/TPBI(400 Å)/LiF(10 Å)/Al(1000 Å), B: ITO/CuPc(100 Å)/NPD(300 Å)/CBP:Ir(5-Phppy)$_3$(4.5%) (200 Å)/CBP:TPBI(9%):Ir(5-Phppy)$_3$(4.5%) (50 Å)/TPBI:Ir(5-Phppy)$_3$(4.5%) (50 Å)/TPBI(400 Å)/LiF (10 Å)/Al(1000 Å), C: ITO/CuPc/NPD/CBP:Ir(5-Phppy)$_3$(200 Å, 4.5%)/TPBI: Ir(5-Phppy)$_3$(50 Å, 4.5%)/TPBI/LiF/Al, and D: ITO/CuPc/NPD/CBP:Ir(5-Phppy)$_3$(200 Å, 4.5%)/CBP: TPBI(13.6%):Ir(5-Phppy)$_3$(50 Å, 4.5%)/TPBI:Ir(5-Phppy)$_3$(50 Å, 4.5%)/TPBI/LiF/Al.

DETAILED DESCRIPTION

Embodiments of the present invention provides efficient phosphorescent OLEDs. The devices of embodiments of the present invention comprise an emissive region having at least two adjacent emissive layers, with at least one emissive layer comprising a first host and another emissive layer comprising a first and second host, and each layer further comprising a phosphorescent emissive material. Having a layer with mixed hosts may alleviate a problem in the prior art associated with single-host emissive layers. The junction of two single-host emissive layers (or of a single emmissive layer) may be characterized by high concentration of charge carriers and/or excitons in a small region of the device, which may adversely affect performance lifetime. A mixed host emissive layer may mitigate this problem, and effectively enhance the lifetime of the device while maintaining its efficiency.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have also been demonstrated to exhibit higher quantum efficiencies than fluorescent OLEDs. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 1, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature. Representative emissive layers include doped or un-doped phosphorescent organo-metallic materials such as disclosed in U.S. Pat. Nos. 6,303,238; 6,310,360; 6,830,828; and 6,835,469; U.S. Patent Application Publication No. 2002-0182441; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

Recently, OLEDs with dual light-emitting layers have demonstrated even higher quantum efficiencies when both the hole and the electron transport hosts were simultaneously doped with a phosphorescent emissive material. Zhou et al., "High-efficiency electrophosphorescent organic light-emitting diodes with double light-emitting layers," Appl. Phys. Lett., vol. 81, No. 21 (2002), which is incorporated by reference in its entirety. Previous double emissive layers, however, are characterized by having a high concentration of charge carriers and/or excitons at the junction of the emissive layers. For instance, in the double emitting layer disclosed in U.S. application Ser. No. 10/618,160 to Tung et al., which is incorporated by reference in its entirety, the different host materials of the adjacent single-host emissive layers are selected as to provide a "heterojunction" between the emissive layers that localizes recombination of electrons and holes at or near the heterojunction. The heterojunction provides a narrow zone for the recombination of electrons and holes. Without being limited to any theory as to why the invention works, it is believed that a narrow recombination/emissive zone may adversely affect the performance lifetime of the device. Using a mixed-host emissive layer, in combination with at least one single-host emissive layer, may spread out the recombination/emissive zone, enabling the high efficiency of a multiple emissive layers, without the low lifetime.

OLEDs having mixed host layers are disclosed in U.S. Pat. No. 5,925,980 to So et al. ("the '980 patent") and in U.S. Pat. No. 6,614,175 to Aziz et al. ("the '175 patent"), which are both incorporated by reference in their entirety. However, these patents do not disclose certain features of embodiments of the present invention.

Figure 1:
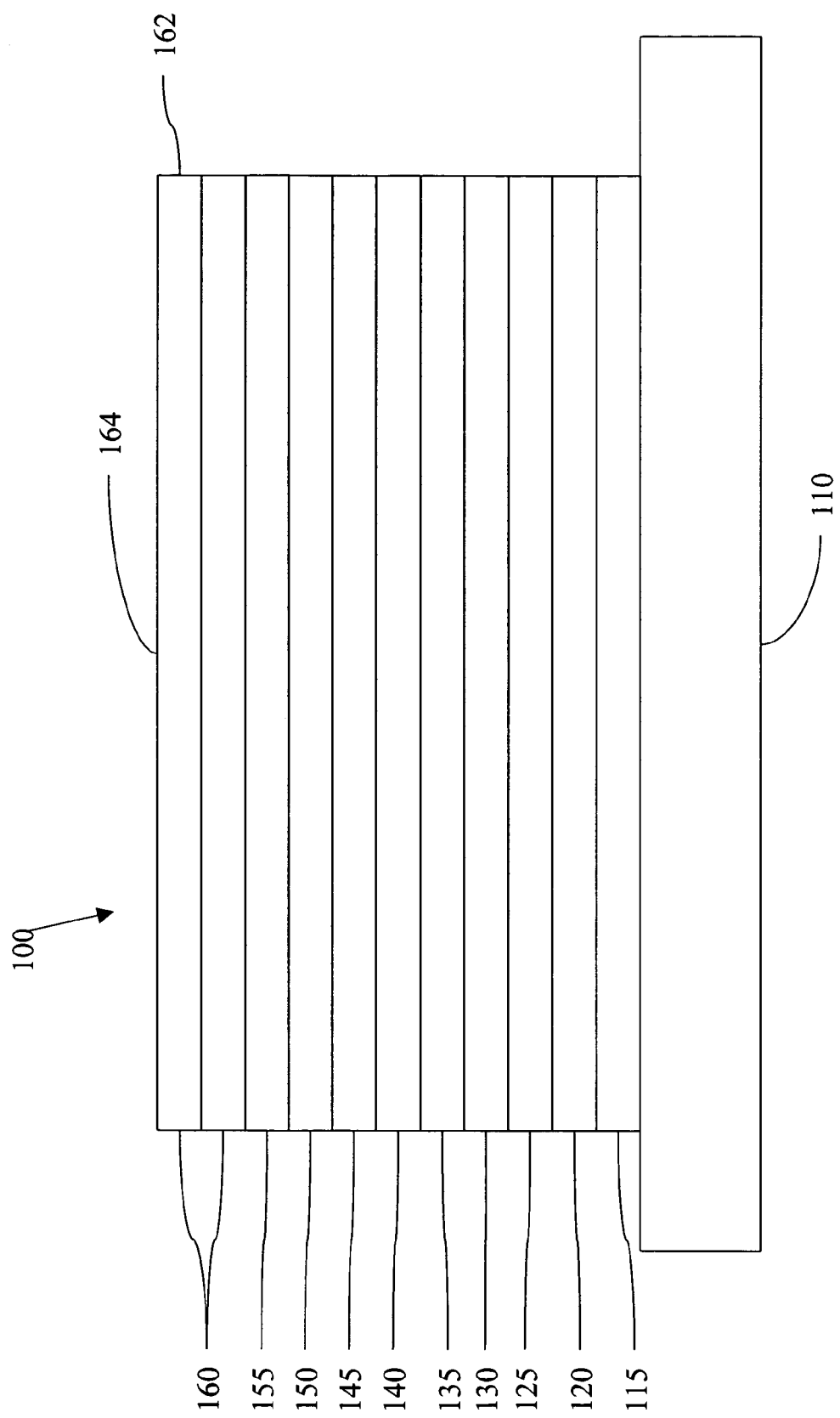
FIG. 1 shows an organic light emitting device having separate electron transport, hole transport, and emissive layers, as well as other layers.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive region 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 125 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003/0230980, which is incorporated by reference in its entirety. Other hole transport layers may be used.

Emissive region 135 is comprised of at least two adjacent emissive layers, each of which includes an organic phosphorescence material capable of emitting light when a current is passed between anode 115 and cathode 160. Emissive region 135 is characterized as capable of emitting light at normal device operating conditions. In some embodiments, host materials include organic materials capable of transporting electrons and/or holes, doped with a phosphorescent emissive material that may trap electrons, holes, and/or excitons, such that excitons relax from the emissive material via a photoemissive mechanism.

As used herein, the term "host," as used with respect to an emissive layer, refers to a material that (1) for the particular device in which the material is a host, the material does not emit light under normal device operating conditions, and (2) the material is present in a quantity sufficient to significantly affect the electronic and/or transport properties of a layer. For many materials, a concentration of 3 weight % may be used as an approximation of a concentration at which the material may function as a "host," with lesser concentrations considered "impurities." As used herein, the term "single-host" emissive layer refers to an emissive layer that contains one, and only one, host material. A single-host layer also includes an emissive dopant, and may also include non-emissive impurities. As used herein, the term "mixed host" emissive layer refers to an emissive layer that contains at least two different host materials, in addition to an emissive dopant.

Emissive region 135 comprises at least one single-host emissive layer and one mixed-host emissive layer, in direct physical contact. Preferably, the mixed-host emissive layer includes the host material of the adjacent single-host emissive layer(s). The first single-host emissive layer may comprise one, and only one, host material (a first host material), as well as an emissive dopant. The mixed-host emissive layer may comprise the first host material, as well as a second host material, and an emissive dopant. In a further embodiment, the emissive region may further comprise a second single-host emissive layer, in direct physical contact with the mixed-host emissive layer. The second single-host layer may comprise the second host material, as well as an emissive dopant. Preferably, a single-host emissive layer that is closer to the cathode than the mixed-host layer is a single-host layer that transports charge primarily by electrons. Preferably, a single-host emissive layer that is closer to the anode than the mixed-host layer is a single-host layer that transports charge primarily by holes In some embodiments, a phosphorescent emissive material may contribute to charge transport in one or more emissive layers of the emissive region. Examples of phosphorescent emissive materials include $Ir(ppy)_3$. Examples of host materials include $Alq_3$, CBP, mCP, and TPBI. Examples of emissive and host materials are disclosed in U.S. Pat. No. 6,303,238 to Thompson et al., which is incorporated by reference in its entirety. Emissive material may be included in emissive region 135 in a number of ways. For example, an emissive small molecule may be incorporated into a polymer. Other emissive layer materials may be used.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003/0230980, which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003/0230980, which are incorporated by reference in their entireties.

As used herein, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of embodiments of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
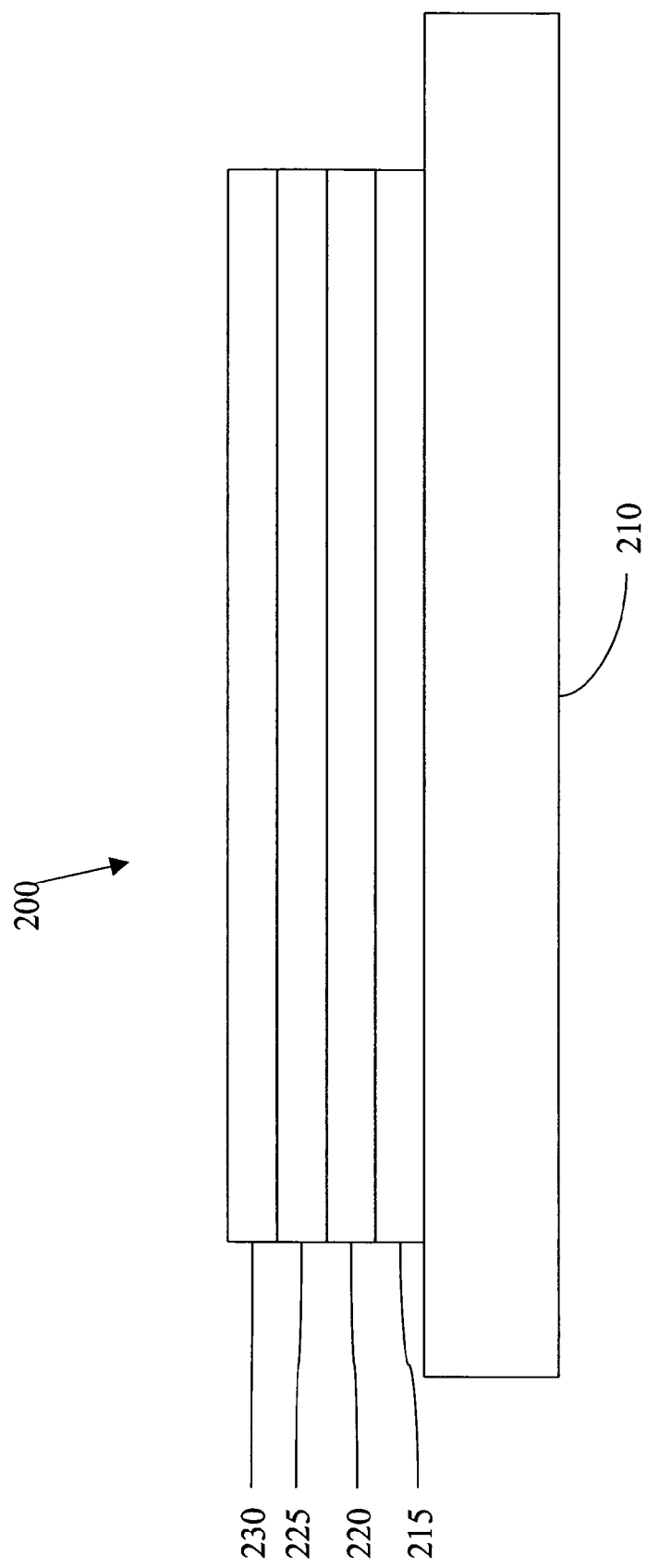
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247, 190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C.–30° C., and more preferably at room temperature (20–25° C).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The devices of embodiments of the present invention comprise an emissive region, wherein the emissive region has at least two emissive layers, a first single-host emissive layer and a mixed-host emissive layer. The first emissive layer is in physical contact with the mixed-host emissive layer. The first emissive layer has one host material (first host) and the mixed-host emissive layer has two host materials, the first host and the second host, wherein the first host and the second host are different chemical compounds. In one embodiment, the concentration of the first host material and the second host material is at least 3% each throughout the mixed-host layer. In another embodiment, the concentration of the second host material is 3%–25% throughout the mixed-host layer.

Figure 3:
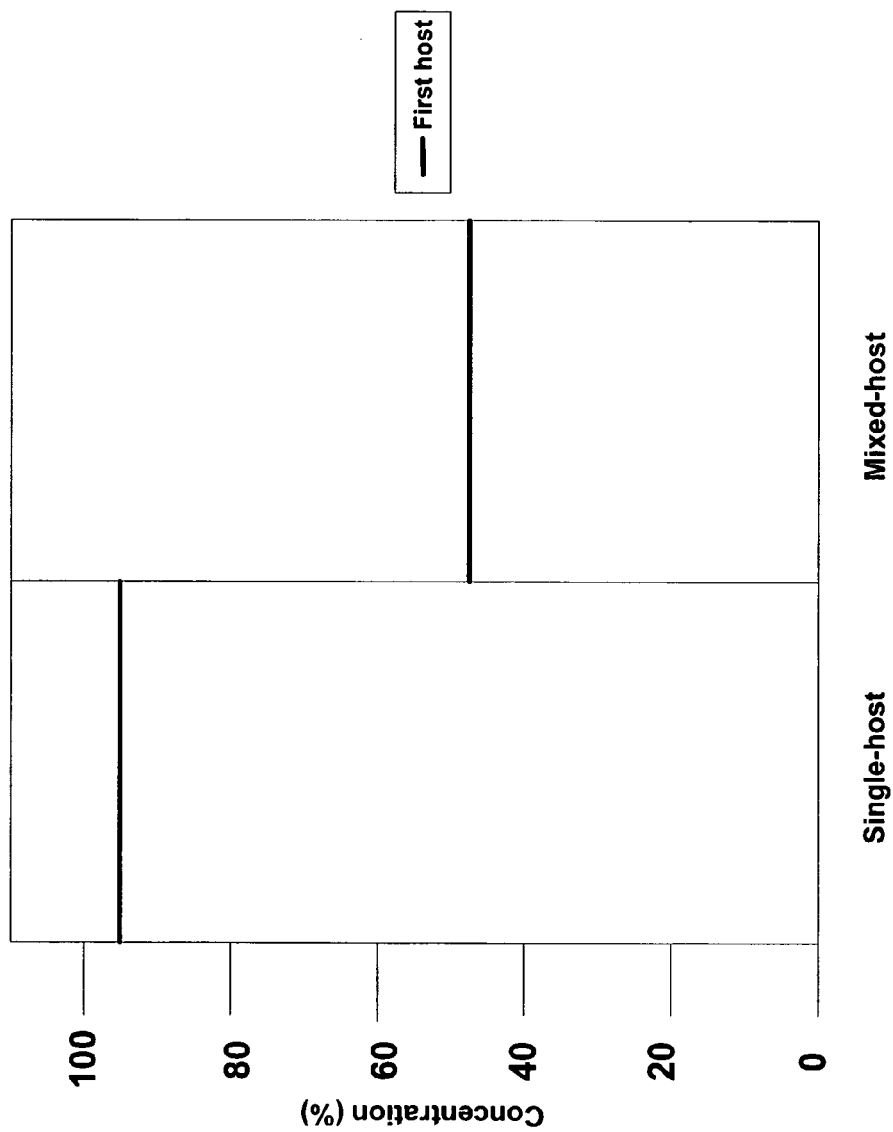
FIG. 3 shows a profile of the concentration of a first host material across the emissive region of a device; there is a discontinuity on the concentration of the first host material at a boundary between a single-host layer and a mixed-host layer; the concentration of the first host material is uniform across the mixed-host layer.

FIG. 3 shows a profile of the concentration of a first host material across the emissive region of a device; there is a discontinuity on the concentration of the first host material at a boundary between a single-host layer and a mixed-host layer; the concentration of the first host material is uniform across the mixed-host layer. For purposes of example, the remainder of the materials in the emissive region are 4% (weight %) emissive dopant, with the remainder being a second host material (for FIGS. 3–6). Percentage concentrations are in weight % unless otherwise indicated. FIG. 3 therefore illustrates a single-host layer including 96% of a first host and 4% of an emissive dopant, and a mixed-host layer having 48% of a first host, 48% of a second host, and 4% of an emissive dopant.

Figure 4:
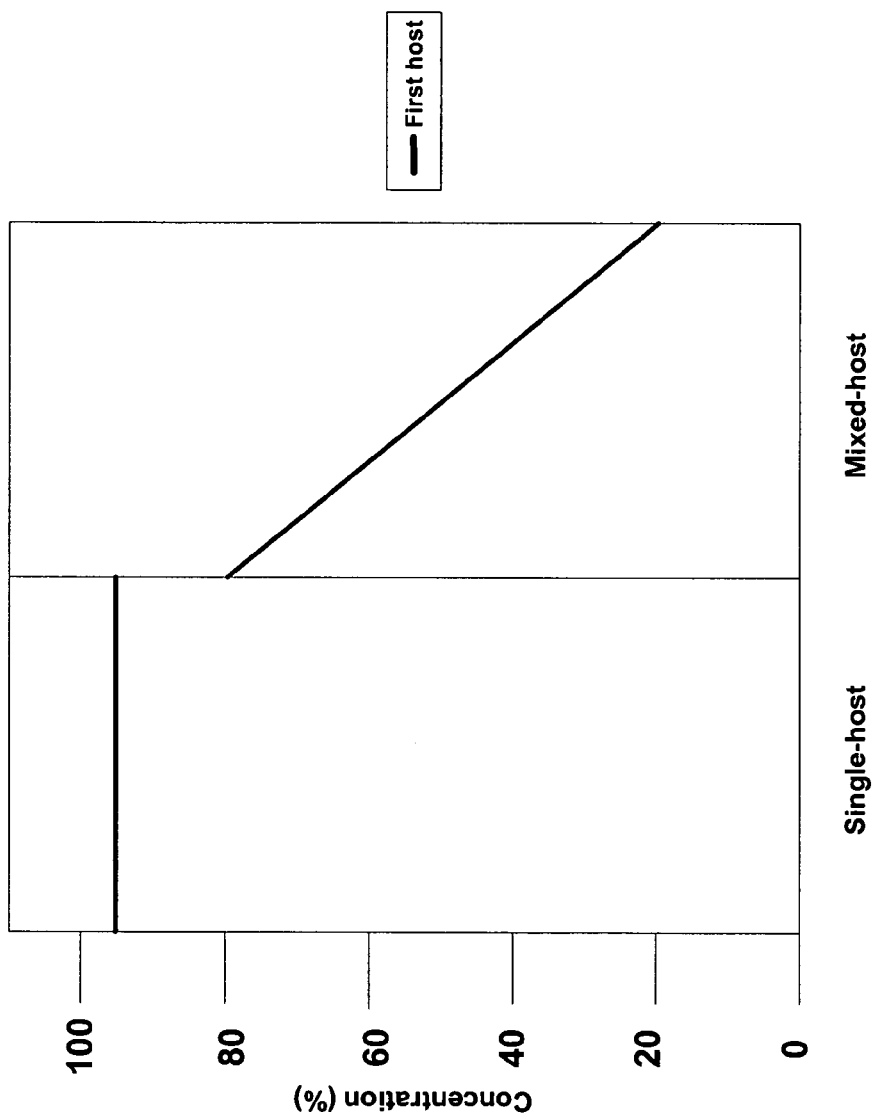
FIG. 4 shows a profile of the concentration of a first host material across the emissive region of a device; there is a discontinuity on the concentration of the first host material at a boundary between a single-host layer and a mixed-host layer; the concentration of the first host material is non-uniform across the mixed-host layer.

FIG. 4 shows a profile of the concentration of a first host material across the emissive region of a device; there is a discontinuity on the concentration of the first host material at a boundary between a single-host layer and a mixed-host layer; the concentration of the first host material is non-uniform across the mixed-host layer. The percentages in the single-host layer are the same as for FIG. 3. The percentages in the mixed-host later are 4% of emissive dopant, with varying percentages of first and second host (adding up to 96% at each point).

Figure 5:
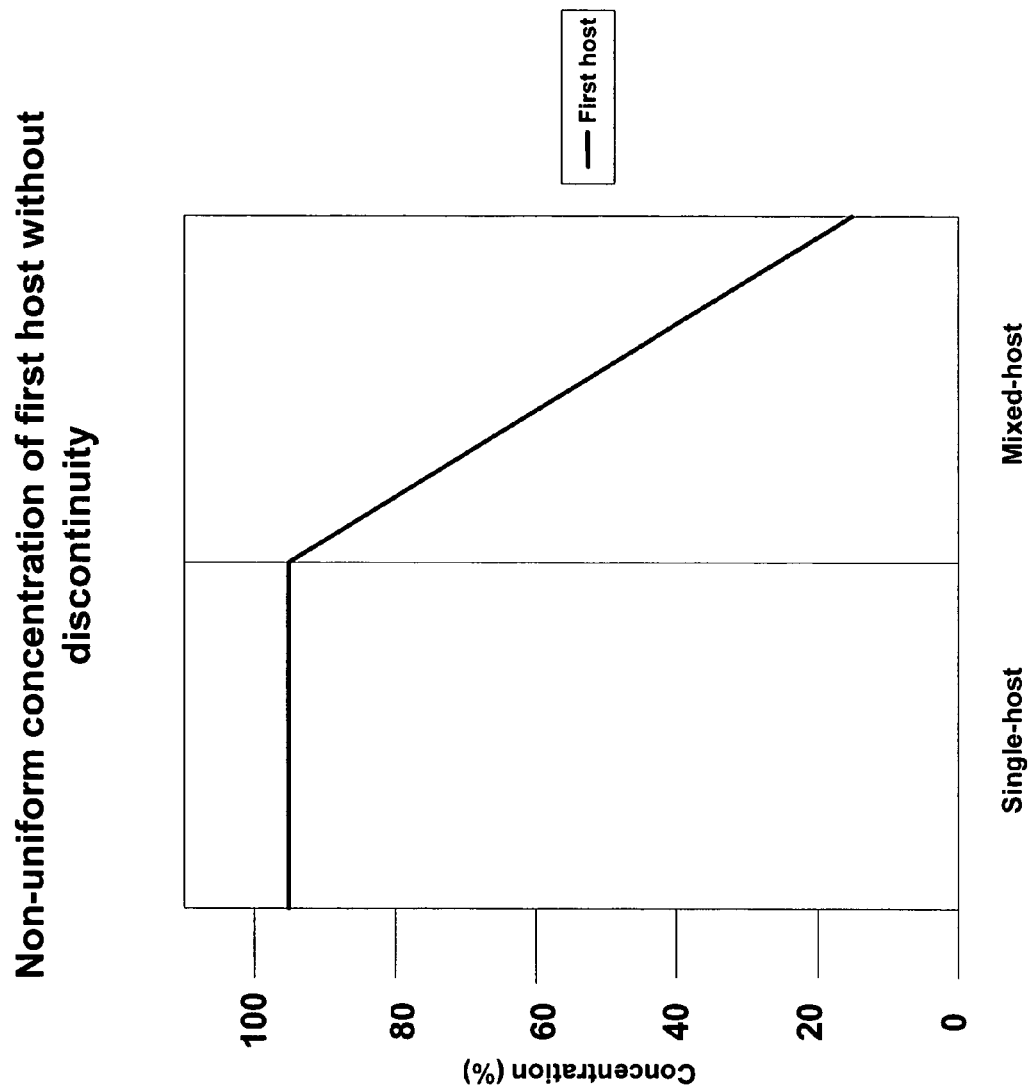
FIG. 5 shows a profile of the concentration of a first host material across the emissive region of a device; there is no discontinuity on the concentration of the first host material at a boundary between a single-host layer and a mixed-host layer; the concentration of the first host material is non-uniform across the mixed-host layer.

FIG. 5 shows a profile of the concentration of a first host material across the emissive region of a device; there is no discontinuity on the concentration of the first host material at a boundary between a single-host layer and a mixed-host layer; the concentration of the first host material is non-uniform across the mixed-host layer. The percentages of each material in FIG. 5 are similar to those in FIG. 4, except the proportions of first host and second host vary differently in the mixed-host layer such that there is a discontinuity in the concentration of first host in FIG. 4 at the single-host/mixed-host interface, but not in FIG. 5.

Discontinuity is characterized by a change in the concentration of the host material by at least 10% over a distance of 1 nm, and would typically occur at a boundary between a single-host layer and a mixed-host layer. Uniformity is characterized by a variation of no more than 3% in the concentration of a host material across a particular layer.

In one embodiment, the first single-host emissive layer and the mixed-host emissive layer contain different emissive compounds. In this case, the device emission spectrum contains the electroluminescence from multiple emissive materials. In another embodiment, each emissive layer includes the same emissive compound. The concentration of emissive compounds may be uniform or non-uniform across the mixed-host layer of the emissive region.

In an embodiment of the present invention, the interface between the first single-host emissive layer and the mixed-host emissive layer provides an electron injection barrier. In this case, it is believed that electrons are inhibited from crossing the interface between the emissive layers. In one embodiment the single-host emissive layer is disposed closer to the anode than the mixed-host emissive layer. Electrons, originating at the cathode, are transported through the mixed-host emissive layer and are inhibited from transport into or through the single-host emissive layer. This may be achieved by selecting different host materials such that the LUMO of the single-host layer disposed closer to the anode has a higher LUMO than the mixed-host layer. The LUMO of a mixed-host layer is characterized as the LUMO of the material having the lowest LUMO of the materials present in the mixed-host layer in significant concentrations. This material preferably has a concentration of at least 3% in the mixed-host layer in order to significantly contribute to charge transport. This could be either the host material or the phosphorescent emissive material. The difference in the LUMO levels between the adjacent emissive layers should be about 0.25 eV, or such a value that would cause any significant impediment towards the transport of electrons across the single-host layer. It should be less than the difference in the LUMO levels between the emissive region and a blocking layer. In another embodiment, a single-host emissive layer disposed closer to the anode than the mixed-host layer may have a lower electron mobility than the mixed-host emissive layer (disposed closer to the cathode).

In a preferred embodiment, the first host material of the single-host layer disposed closer to the anode is a hole transport material. In a more preferred embodiment, a hole transport layer, which does not include a phosphorescent emissive material, is disposed between the first single-host emissive layer and the anode, and the hole transport layer comprises the first host material.

In another embodiment of the present invention, the interface between the first single-host emissive layer and the mixed-host emissive layer provides a hole injection barrier. In this case, holes are inhibited from crossing the interface between the emissive layers. In one embodiment the single-host emissive layer is disposed closer to the cathode than the mixed-host emissive layer. Holes, originating at the anode, are transported through the mixed-host emissive layer and are inhibited from transport into or through the single-host emissive layer. This may be achieved by selecting different host materials such that the HOMO of the single-host layer disposed closer to the cathode has a lower HOMO than the mixed-host layer. The HOMO of a mixed-host layer is characterized as the HOMO of the material having the highest HOMO of the materials present in the mixed-host layer in significant concentrations. This material preferably has a concentration of at least 3% in the mixed-host layer in order to significantly contribute to charge transport. This could be either the host material or the phosphorescent emissive material. The difference in the HOMO levels between the adjacent emissive layers should be about 0.25 eV, or such a value that would cause any significant impediment towards the transport of holes across the single-host layer. It should be less than the difference in the HOMO levels between the emissive region and a blocking layer. In another embodiment, a single-host emissive layer disposed closer to the cathode than the mixed-host layer may have a lower hole mobility than the mixed-host emissive layer (disposed closer to the anode).

In a preferred embodiment, the first host material of the single-host layer disposed closer to the cathode is an electron transport material. In a more preferred embodiment, an electron transport layer, which does not include a phosphorescent emissive material, is disposed between the first single-host emissive layer and the cathode, and the electron transport layer comprises the first host material.

The emissive region may be further comprised of additional emissive layers. In a most preferred embodiment of the invention, the emissive region has three emissive layers. Two of the three emissive layers have the architecture and properties described above. The third emissive layer is a single-host layer (second single-host emissive layer) adjacent to the mixed-host layer and comprises a second host and a phosphorescent emissive material. The mixed-host layer of this embodiment comprise a first single-host material of the first single-host layer and the second host material of the second single-host layer, wherein the first and second host materials are different chemical compounds.

Figure 6:
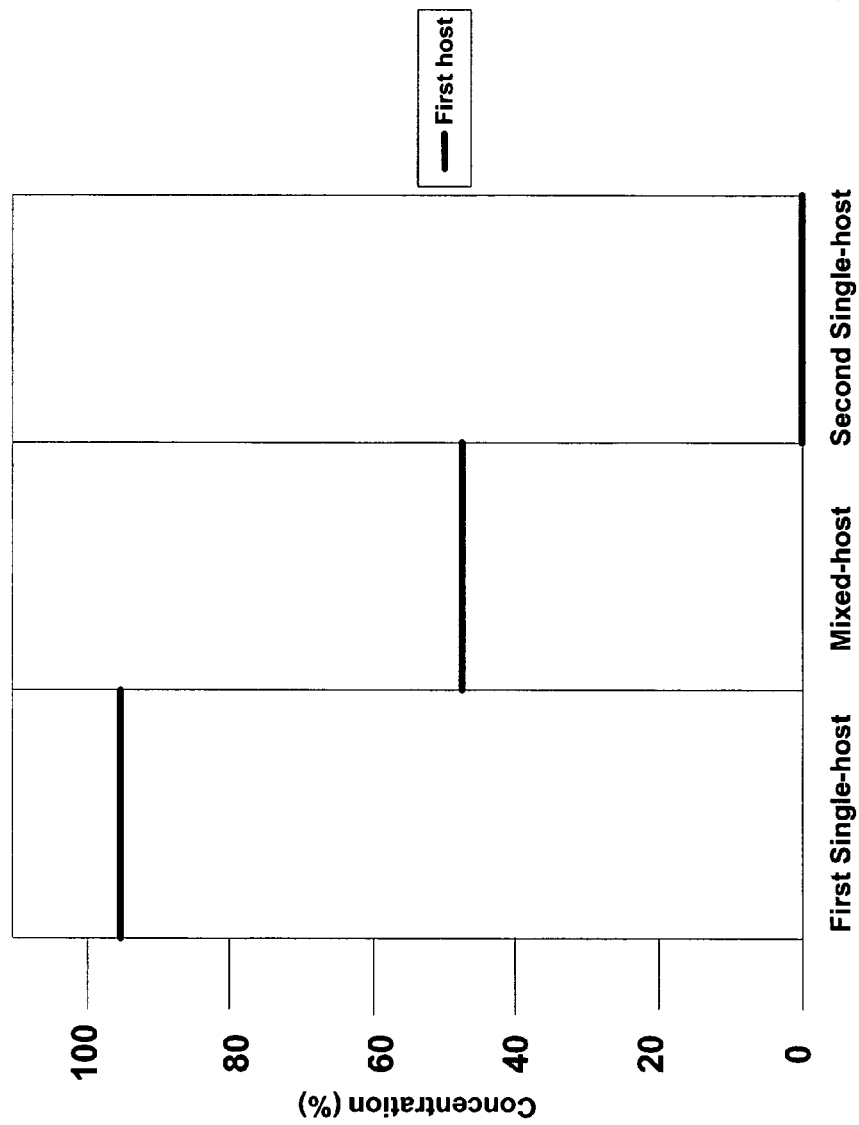
FIG. 6 shows a profile of the concentration of a first host material across the emissive region of a device with three emissive layers; there is a discontinuity on the concentration of the first host material at a boundary between a first single-host layer and a mixed-host layer and between a mixed-host layer and a second single-host layer; the concentration of the first host material is uniform across the mixed-host layer.

FIG. 6 shows a profile of the concentration of a first host material across the emissive region of a device with three emissive layers; there is a discontinuity on the concentration of the first host material at a boundary between a first single-host layer and a mixed-host layer and between a mixed-host layer and a second single-host layer; the concentration of the first host material is uniform across the mixed-host layer. A series of mixed-host emissive layers may be used, having steps in the concentration of host materials. FIG. 6 illustrates 2 such steps—the concentration of first host material steps from 96% to 48% to zero, the concentration of second host material steps from zero to 48% to 96%, and the concentration of emissive dopant is 4% throughout the emissive region. A larger number of steps may be used.

In an emissive region that has a second single-host layer, there may or may not be discontinuities on the concentration of a host material at the boundary between emissive layers. An emissive region having no discontinuity on the concentrations of the various hosts may be preferred because it is believed that such an emissive region may be more effective at spreading the recombination zone. However, an emissive region where concentrations of the various hosts change in steps may be preferred for ease of fabrication, depending upon the fabrication equipment available. In addition, the concentrations of host materials may be uniform or non-uniform across the mixed-host layer, as illustrated in FIGS. 3–6. The emissive layers may have the same emissive phosphorescent material. Alternatively, the first single-host emissive layer may have a phosphorescent emissive material different from the phosphorescent emissive material of the mixed-host layer and/or the second single-host emissive layer.

Preferably, the mixed-host emissive layer has a thickness of about 20–300 angstroms. A thickness of at least about 20 angstroms is preferred because a thinner mixed-host layer may not be thick enough to have a significant spreading effect on the recombination/emissive zone. A thickness of 300 angstroms or less is preferred because it is believed that a thicker mixed-host layer may undesirably increase the drive voltage of a device without a commensurate increase in efficiency. Each single host layer preferably also has a thickness of about 20–300 angstroms. As discussed above, a thickness of no more than 300 angstroms is preferred to avoid an increase in drive voltage. A single host layer with a thickness of less than about 20 angstroms is believed to not have a significant effect on the charge transport and recombination for the device. Most preferably, the entire emissive region, which includes the mixed host layer and at least one single host emissive layer, has a thickness not exceeding 300 angstroms, to avoid undesirably high drive voltages. Devices having thicknesses outside of these ranges may be used, however, depending upon the specific materials used and/or the requirements of the commercial application in which the device is used.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The mixed-host emissive layer of the embodiments of the invention, as illustrated in FIGS. 3–6, may be deposited using various methods. For instance, the first host and second host materials may be coevaporated onto the mixed-host layer to create a uniform concentration profile for each host material. Alternatively, a mixed-host layer may be deposited by shielding one source of host material by gradually closing its container while gradually opening the container of the other host material thereby creating a non-uniform concentration profile of each host material in the mixed-host layer. The concentrations of each host material may be further controlled using deposition by OVJP techniques.

In one embodiment, the first single-host emissive layer is disposed closer to the cathode that the mixed-host emissive layer, and the second single-host emissive layer is disposed closer to the anode than the mixed-host emissive layer. In a preferred embodiment, the first host material is an electron transport material and the second host material is a hole transport material. In a most preferred embodiment, an electron transport layer, which does not include a phosphorescent emissive material, is disposed between the first single-host emissive layer and the cathode, and the electron transport layer comprises the first host material. In the same embodiment, a hole transport layer, which does not include a phosphorescent emissive material, is disposed between the second single-host emissive layer and the anode, and the hole transport layer comprises the second host material. In another preferred embodiment, the first single-host emissive layer has a lower LUMO than the mixed emissive layer, and the second single-host emissive layer has a higher HOMO than the first emissive layer.

The HOMO and LUMO energy levels for organic materials to be used in OLEDs have been estimated in several ways. The two common methods for estimating HOMO levels are solution electrochemistry and ultraviolet photoelectron spectroscopy (UPS). The two common methods for estimating LUMO levels are solution electrochemistry and inverse photoemission spectroscopy. These energies are useful for predicting the interactions described herein between the emissive material and the host material of the emissive layer. Additionally, the alignment of the HOMO and LUMO levels between adjacent layers may control the passage of hole and electrons between the two layers.

The most common method for determining oxidation and reduction potentials is cyclic voltammetry. A simple description of this process is as follows. The unknown is dissolved along with a high concentration of electrolyte. Electrodes are inserted and the voltage scanned in either the positive or negative direction (depending on whether an oxidation or reduction is being performed). The presence of a redox reaction is indicated by current flowing through the cell. The voltage scan is then reversed and the redox reaction is reversed. If the areas of the two redox waves are the same the process was reversible. The potential at which these events occur give the value of the reduction or oxidation potential relative to a reference. The reference can be an external electrode, such as Ag/AgCl or SCE, or it can be an internal one, such as ferrocene, which has a known oxidation potential. The latter is often preferred for organic solvents, since the common reference electrodes are water based. Although this is a solution process, in contrast to the solid state OLED, and the reference may be hard to adjust to give values relative to vacuum, the method is good for giving relative numbers. One useful parameter that may come from electrochemical measurement is the carrier gap. If both the reduction and oxidation are reversible, one can determine the energy difference between the hole and the electron (i.e. taking an electron out of the HOMO versus putting one into the LUMO). This value is important to determine the LUMO energy from a well defined HOMO energy. If either of the redox processes are not reversible, the carrier gap cannot be determined by this method.

The preferred method to estimate HOMO energies in the solid state is UPS. This is a photoelectric measurement, where the solid is irradiated with UV photons. The energy of the photons is gradually increased until photogenerated electrons are observed. The onset of ejected electrons gives the energy of the HOMO. The photons at that energy have just enough energy to eject an electron form the top of the filled levels. Inverse photoemission involves pre-reducing the sample and then probing the filled states to estimate the LUMO energies. The best accepted method for determining HOMO energies is UPS, which gives values in eV relative to vacuum. This is the binding energy for the electron.

Another important parameter is the optical gap. This value is typically determined from the intersection of the normalized absorption and emission spectra. For a molecule that has very little structural rearrangement in the excited state, the gap between the absorption and emission $\lambda_{max}$ values is rather small and this intersection energy is a good estimate of the optical gap (the 0—0 transition energy). This is often held to be the HOMO-LUMO gap. In some cases, this can be a poor estimation if the shift between the absorption and emission maxima is large (Stokes shift), such that the optical gap is hard to determine. If there is a structural rearrangement in the excited state or the absorption that is measured is not the one for the lowest energy excited state, then there can be a large error. Alternatively, the edge of the absorption or emission bands may be used to estimate the optical gap. In some cases, this is a poor estimate. When the optical gap is used to estimate LUMO energies from a measured HOMO energy, it is most useful for a well behaved molecule (i.e. a small Stokes shift), where it is close to the HOMO-LUMO gap. Even in this case, a carrier gap may be a better estimate and may be larger than the optical gap. If one is concerned about exciton blocking, the edge of the absorption band is more useful, as this will give the energy below which excitons will not be efficiently trapped. That is to say, if an exciton of lower energy than the band edge of the materials approaches a layer with a higher energy absorption edge the likelihood that the exciton will be transferred into this material is low. For molecules emitting from triplet excited states, the absorption edge is the best estimate, since the intersystem crossing may lead to a very large Stokes shift.

A first energy level (HOMO or LUMO) is considered "less than" or "lower" than a second energy level if it is lower on a conventional energy level diagram, which means that the first energy level would have a value that is more negative than the second energy level. A first energy level (HOMO or LUMO) is considered "higher" than a second energy level if it is higher on a conventional energy level diagram, which means that the first energy level would have a value that is less negative than the second energy level. For example, the HOMO of CBP −5.32 eV and the HOMO of TPBI is −5.70 eV, therefore the HOMO of CBP is 0.38 eV "higher" than the HOMO of TPBI. Similarly, the LUMO of mCP is −0.77 eV and the LUMO of CBP is −1.23 eV, therefore the LUMO of mCP is 0.46 eV "higher" than the LUMO of CBP. The above values were determined using density functional calculations performed using the Spartan 02 software package, available from Wavefunction Inc. of Irvine, Calif., at the B3LYP/6-31G* level. A pseudo potential option can be used for species containing heavy metals such as $Ir(ppy)_3$. Density functional calculations have been demonstrated in the literature to be able to qualitatively predict energies of organic and inorganic compounds.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

| | |
|---|---|
| CBP: | 4,4'-N,N-dicarbazole-biphenyl |
| m-MTDATA | 4,4',4''-tris(3-methylphenylphenlyamino)triphenylamine |
| $Alq_3$: | 8-tris-hydroxyquinoline aluminum |
| Bphen: | 4,7-diphenyl-1,10-phenanthroline |
| n-BPhen: | n-doped BPhen (doped with lithium) |
| $F_4$-TCNQ: | tetrafluoro-tetracyano-quinodimethane |
| p-MTDATA: | p-doped m-MTDATA (doped with $F_4$-TCNQ) |
| $Ir(ppy)_3$ or Irppy: | tris(2-phenylpyridine)-iridium |
| $Ir(ppz)_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |

-continued

| | |
|---|---|
| CuPc: | copper phthalocyanine. |
| ITO: | indium tin oxide |
| NPD: | N,N'-diphenyl-N-N'-di(1-naphthyl)-benzidine |
| TPD: | N,N'-diphenyl-N-N'-di(3-toly)-benzidine |
| BAlq: | aluminum(III)bis(2-methyl-8-quinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |
| PEDOT:PSS: | an aqueous dispersion of poly(3,4-ethylene-dioxythiophene) with polystyrenesulfonate (PSS) |
| TPBI | 2,2',2''-(1,3,5-benzenetriyl)tris-(1-phenyl-1H-benzimidazole) |
| $Ir(5\text{-}Phppy)_3$ | tris[5-phenyl(2-phenylpyridine)]iridium(III) |

Experimental:

Specific representative embodiments of the invention will now be described, including how such embodiments may be made. It is understood that the specific methods, materials, conditions, process parameters, apparatus and the like do not necessarily limit the scope of the invention.

EXAMPLE 1

Device Fabrication and Measurement

Phosphorescent OLEDs A, B, C and D were fabricated having the device structure ITO/CuPc/NPD/Emissive Region/TPBI/LiF/Al. Devices A, B, and C were fabricated on a single substrate by high vacuum thermal deposition. The anode electrode is ~1200 Å of iridium tin oxide (ITO). Copper phthalocyanine (CuPc) (100 Å) as the hole injection layer (HIL) and N,N'-diphenyl-N—N'-di(1-naphthyl)-benzidine (NPD) (300 Å) as the hole transport layer (HTL) were deposited sequentially on the anode for all devices at the same time. Each of devices A, B, and C have different emissive regions. A layer of CPB (200 Å) doped with $Ir(5\text{-}Phppy)_3$ (4.5 weight %) was deposited onto each of devices A, B and C as a single host emissive layer in the emissive region. Masking was then used to deposit onto only device A a mixed host organic layer (50 Å) of CBP (91%) and TPBI (4.5%) doped with $Ir(5\text{-}Phppy)_3$ (4.5%). Masking was then used to deposit onto only device B a mixed host organic layer (50 Å) of CBP (86.5%) and TPBI (9%) doped with $Ir(5\text{-}Phppy)_3$ (4.5%). To complete the emissive regions, a layer of TPBI (50 Å) doped with $Ir(5\text{-}Phppy)_3$ (4.5%) was deposited onto all devices. The cathode, LiF (10 Å) followed by Al (1000 Å), was deposited onto each of devices A, B and C at the same time. Basically, devices A, B and C are identical except for the emissive region. Each of the devices have emissive regions with a first single host (CBP) layer and a second single host (TPBI) layer. Devices A and B each have a mixed host emissive layer in between the two single host emissive layers, where the hosts being mixed are the hosts from the single host layers. Device C does not have a mixed host layer. All emissive layers are doped with $Ir(5\text{-}Phppy)_3$ (4.5%).

Device D was fabricated on a separate substrate, using similar techniques. The layers of Device D are identical to those of Devices A, B and C, except for the emissive region. The emissive region of Devices A, B, and D comprised two single-host doped layers and a mixed host doped layer. For comparison, Device C was fabricated with an emissive region comprised of two single-host doped layers and no mixed host layer. The emissive layer of each device was doped with phosphorescent Ir(5-Phppy)$_3$.

The device structures are as follows.

EXAMPLE 2

Device A

An OLED was prepared with the structure ITO/CuPc(100 Å)/NPD(300 Å)/CBP:Ir(5-Phppy)$_3$(4.5%) (200 Å)/CBP:TPBI(4.5%):Ir(5-Phppy)$_3$(4.5%) (50Å)/TPBI:Ir(5-Phppy)$_3$ (4.5%) (50 Å)/TPBI(400 Å)/LiF(10 Å)/Al(1000 Å).

EXAMPLE 3

Device B

An OLED was prepared with the structure ITO/CuPc(100 Å)/NPD(300 Å)/CBP:Ir(5-Phppy)$_3$(4.5%) (200 Å)/CBP:TPBI(9%):Ir(5-Phppy)$_3$(4.5%) (50 Å)/TPBI:Ir(5-Phppy)$_3$ (4.5%) (50 Å)/TPBI(400 Å)/LiF(10 Å)/Al(1000 Å).

COMPARATIVE EXAMPLE 4

Device C

An OLED was prepared with the structure ITO/CuPc(100 Å)/NPD(300 Å)/CBP:Ir(5-Phppy)$_3$(4.5%) (200 Å)/TPBI:Ir(5-Phppy)$_3$(4.5%) (50 Å)/TPBI(400 Å)/LiF(10 Å)/Al(1000 Å).

EXAMPLE 5

Device D

An OLED was prepared with the structure ITO/CuPc(100 Å)/NPD(300 Å)/CBP:Ir(5-Phppy)$_3$(4.5%) (200 Å)/CBP:TPBI(13.6%):Ir(5-Phppy)$_3$(4.5%) (50 Å)/TPBI:Ir(5-Phppy)$_3$(4.5%) (50 Å)/TPBI(500 Å)/LiF(10 Å)/Al(1000 Å).

Figure 7:
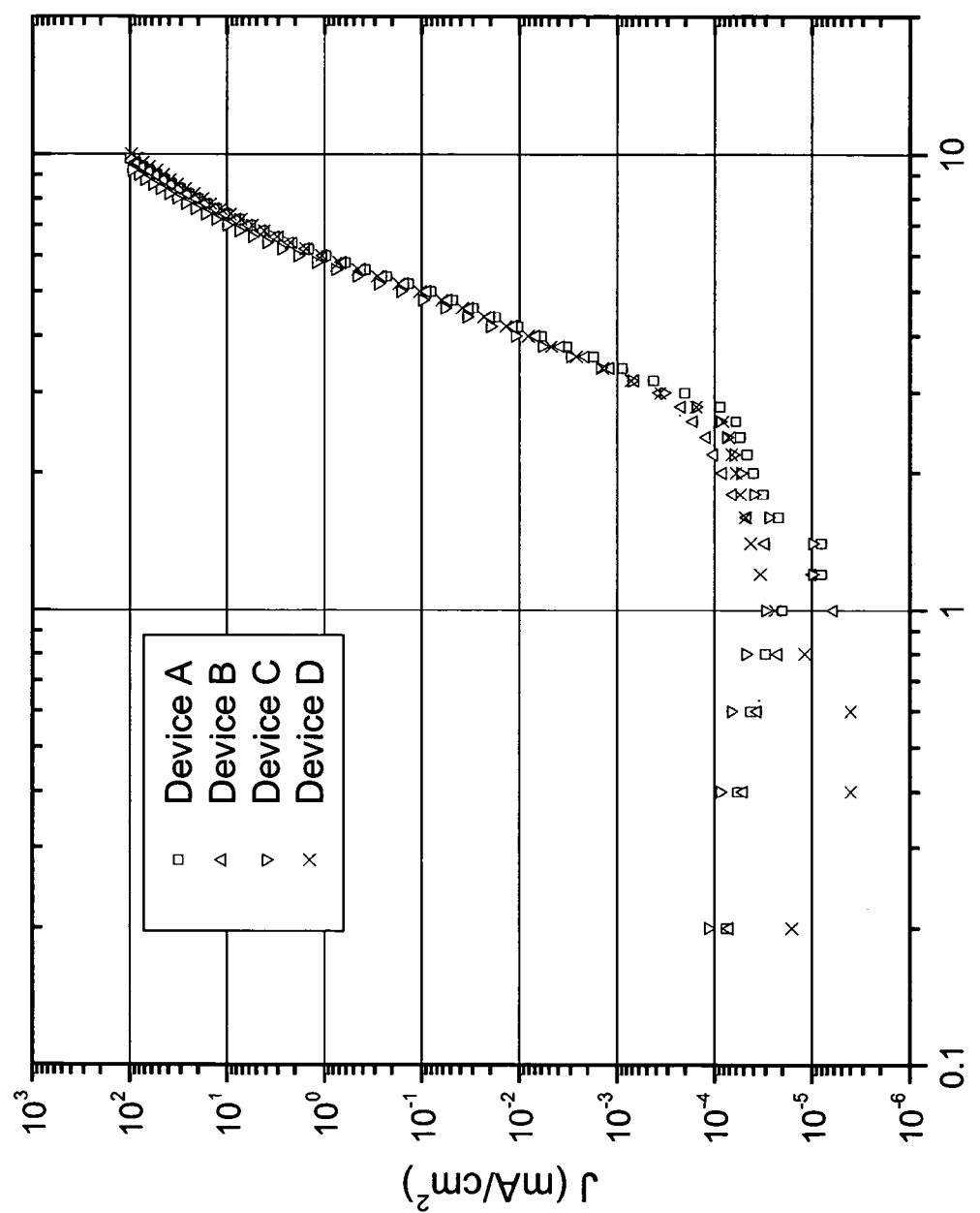
FIG. 7 shows plots of current density (mA/cm$^2$) vs. voltage for devices of FIGS. 3–6 having the device structures A: ITO/CuPc(100 Å)/NPD(300 Å)/CBP:Ir(5-Phppy)$_3$ (4.5%) (200 Å)/CBP:TPBI(4.5%):Ir(5-Phppy)$_3$(4.5%) (50 Å)/TPBI:Ir(5-Phppy)$_3$(4.5%) (50 Å)/TPBI(400 Å)/LiF(10 Å)/Al(1000 Å), B: ITO/CuPc(100 Å)/NPD(300 Å)/CBP:Ir(5-Phppy)$_3$(4.5%) (200 Å)/CBP:TPBI(9%):Ir( 5-Phppy)$_3$(4.5%) (50 Å)/TPBI:Ir(5-Phppy)$_3$(4.5%) (50 Å)/TPBI(400 Å)/LiF (10 Å)/Al(1000 Å), C: ITO/CuPc/NPD/CBP:Ir(5-Phppy)$_3$(200 Å, 4.5%)/TPBI: Ir(5-Phppy)$_3$(50 Å, 4.5%)/TPBI/LiF/Al, and D: ITO/CuPc/NPD/CBP:Ir(5-Phppy)$_3$(200 Å, 4.5%)/CBP: TPBI(13.6%):Ir(5-Phppy)$_3$(50 Å, 4.5%)/TPBI:Ir(5-Phppy)$_3$(50 Å, 4.5%)/TPBI/LiF/Al.

FIG. 7 shows plots of current density (mA/cm$^2$) vs. voltage for devices of FIGS. 3–6 having the device structures A, B, C, and D. FIG. 7 shows that devices having a mixed host layer maintain their current density vs. voltage profile relative to similar devices without a mixed host layer.

FIG. 8 shows plots of luminous efficiency (cd/A) and power efficiency (1 m/W) vs. brightness (cd/m$^2$) for devices of FIGS. 3–6 having the device structures A, B, C, and D. FIG. 8 shows that devices having a mixed host layer maintain their efficiency relative to similar devices without a mixed host layer.

FIG. 9 shows plots of normalized luminance decay for devices of FIGS. 3–6 having the device structures A, B, C, and D. FIG. 9 shows that devices having a mixed host layer have significantly improved lifetimes relative to similar devices without a mixed host layer.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device comprising:
    an emissive region disposed between and electrically connected to an anode and a cathode, wherein the emissive region comprises:
        a first single-host emissive layer, comprising a first non-emissive host material and a phosphorescent dopant, and
        a mixed-host emissive layer in direct contact with the first single-host emissive layer, comprising the first non-emissive host material, a second non-emissive host material, and the phosphorescent dopant.

2. The device of claim 1, wherein the concentration of the first non-emissive host material and the second non-emissive host material is uniform across the mixed-host emissive layer.

3. The device of claim 1, wherein the concentration of the first non-emissive host material is non-uniform across the mixed-host emissive layer.

4. The device of claim 3, wherein there is no discontinuity in the concentration of the first non-emissive host material across the emissive region.

5. The device of claim 1, wherein the first single-host emissive layer is disposed closer to the cathode than the mixed-host emissive layer.

6. The device of claim 5, wherein the first non-emissive host material is an electron transport material.

7. The device of claim 6, further comprising an electron transport layer disposed between the first single-host emissive layer and the cathode, wherein the electron transport layer comprises the first non-emissive host material, and wherein the electron transport layer does not include a phosphorescent emissive material.

8. The organic light emitting device of claim 5, wherein the first single-host emissive layer has a lower LUMO than the mixed-host emissive layer.

9. The device of claim 1, wherein the first single-host emissive layer is disposed closer to the anode than the mixed-host emissive layer.

10. The device of claim 9, wherein the first non-emissive host material is a hole transport material.

11. The device of claim 10, further comprising a hole transport layer disposed between the first single-host emissive layer and the anode, wherein the hole transport layer comprises the first non-emissive host material, and wherein the hole transport layer does not include a phosphorescent emissive material.

12. The organic light emitting device of claim 9, wherein the first single-host emissive layer has a higher HOMO than the mixed-host emissive layer.

13. The device of claim 1, wherein the concentration of the first non-emissive host material is at least 3% (wt. %) throughout the mixed-host layer, and the concentration of the second non-emissive host material is at least 3% (wt.) throughout the mixed-host layer.

14. The device of claim 13, wherein the concentration of the second non-emissive host material is 3%–25% (wt. %) throughout the mixed-host layer.

15. The device of claim 1, wherein the mixed-host layer has a thickness of 20–300 angstroms.

16. The organic light emitting device of claim 1, wherein an interface between the first single-host emissive layer and the mixed-host emissive layer provides an electron injection barrier, a hole injection barrier, or both.

17. The device of claim 1, wherein the emissive region further comprises a second single-host emissive layer in direct contact with the mixed-host emissive layer, wherein the second single-host emissive layer comprises the second non-emissive host material and the phosphorescent dopant.

18. The device of claim 17, wherein the first single-host emissive layer is disposed closer to the cathode than the mixed-host emissive layer, and wherein the second single-host emissive layer is disposed closer to the anode than the mixed-host emissive layer.

19. The device of claim 18, wherein the first non-emissive host material is an electron transport material and the second non-emissive host material is a hole transport material.

20. The device of claim 19, further comprising:
   an electron transport layer disposed between the first single-host emissive layer and the cathode, wherein the electron transport layer comprises the first non-emissive host material, and wherein the electron transport layer does not include a phosphorescent emissive material;
   a hole transport layer disposed between the second single-host emissive layer and the anode, wherein the hole transport layer comprises the second non-emissive host material, and wherein the hole transport layer does not include a phosphorescent emissive material.

21. The device of claim 17, wherein the mixed-host layer has a thickness of 20–300 angstroms.

22. The organic light emitting device of claim 17, wherein an interface between the first single-host emissive layer and the mixed-host emissive layer provides an electron injection barrier, a hole injection barrier, or both, and wherein an interface between the second single-host emissive layer and the mixed-host emissive layer provides an electron injection barrier, a hole injection barrier, or both.

23. The organic light emitting device of claim 18, wherein the first single-host emissive layer has a lower LUMO than the mixed-host emissive layer, and wherein the second single-host emissive layer has a higher HOMO than the mixed-host emissive layer.

24. The device of claim 17, wherein the concentration of the first host material is at least 3% (wt. %) throughout the mixed-host layer, and the concentration of the second host material is at least 3% (wt. %) throughout the mixed-host layer.

25. The device of claim 24, wherein the concentration of the second host material is 3%–15% (wt. %) throughout the mixed-host layer.

* * * * *